(12) United States Patent  
Mohan

(10) Patent No.: US 8,873,592 B1  
(45) Date of Patent: Oct. 28, 2014

(54) SYSTEM AND METHOD FOR ADDING A LOW DATA RATE DATA CHANNEL TO A 100BASE-T ETHERNET LINK

(75) Inventor: Jitendra Mohan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 1847 days.

(21) Appl. No.: 11/975,421

(22) Filed: Oct. 19, 2007

(51) Int. Cl.  
*H03M 5/16* (2006.01)

(52) U.S. Cl.  
USPC .............................. 370/538; 370/543; 341/56

(58) Field of Classification Search  
None  
See application file for complete search history.

(56) References Cited

U.S. PATENT DOCUMENTS

| | | | |
|---|---|---|---|
| 4,736,464 A * | 4/1988 | Tanson | 398/176 |
| 5,280,500 A | 1/1994 | Mazzola et al. | |
| 6,301,309 B1 | 10/2001 | Hee et al. | |
| 6,456,666 B1 * | 9/2002 | Gabara et al. | 375/259 |
| 6,977,971 B2 | 12/2005 | Orlandini | |
| 7,065,133 B1 | 6/2006 | Phanse et al. | |

OTHER PUBLICATIONS

Anu A. Gokhale, Introduction to Telecommunications, Jun. 8, 2004, Thomson Delmar Learning, Edition 2, ISBN 1-4018-5648-9, pp. 215-217.*

George Schroeder, "Emerging Test Challenges for Multi-Level-Signal Gigabit Ethernet Part 1: Introduction", 1999 IEEE, 4 pages.

"MLT-3 encoding", Wikipedia, May 14, 2007, 1 page.

A.N. Coles, "A new 8B10B block code for high speed data transmission over unshielded twisted pair channels", Hewlett-Packard Laboratories, 6 pages.

Alistair N. Coles, "New pseudoternary line code for high speed twisted pair data links", Hewlett-Packard Company 1995, 10 pages.

* cited by examiner

*Primary Examiner* — Alex Skripnikov  
(74) *Attorney, Agent, or Firm* — Andrew Viger; Frederick J. Telecky, Jr.

(57) ABSTRACT

A system and method is disclosed for adding a low data rate data channel to a 100Base-T Ethernet link without significantly impacting an IEEE defined 100Base-T protocol for the Ethernet link. A dual data channel transmitter encodes a high data rate data stream in an MLT-3 encoder and encodes a low data rate data stream using bit representations that are not valid bit representations in the MLT-3 encoder. The dual data channel transmitter transmits both of the encoded bit streams in a dual data stream. A dual data channel receiver receives the dual data stream and separates and decodes the two bit streams. A low data rate data channel is provided in conjunction with a high data rate data channel without significantly impacting the operation of the high data rate data channel.

20 Claims, 4 Drawing Sheets

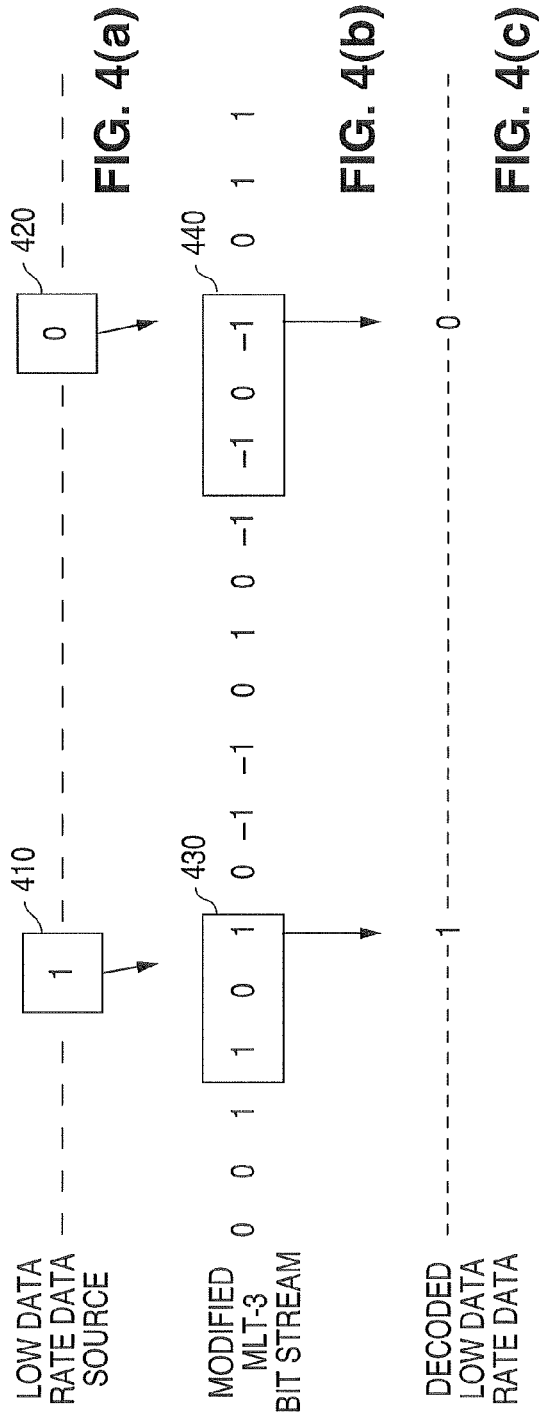

SYSTEM AND METHOD FOR ADDING A LOW DATA RATE DATA CHANNEL TO A 100BASE-T ETHERNET LINK

TECHNICAL FIELD OF THE INVENTION

The present invention relates generally to data transmission techniques and, more particularly, to a system and method for adding a low data rate data channel to a 100Base-T Ethernet link.

BACKGROUND OF THE INVENTION

In the data transmission industry the 100Base-T standard is an Ethernet wiring standard for Local Area Networks (LANs). The 100Base-T standard supports data transfer rates up to one hundred megabits per second (100 Mbps) over unshielded twisted pair copper wire cable or optical fiber cable. The 100Base-T standard is often referred to as "fast Ethernet." The IEEE standard for the 100Base-T standard is IEEE 802.3u.

There are versions of the 100Base-T standard for three different cabling schemes. The first is 100Base-TX for two pairs of high quality twisted pair wires. The second is 100Base-T4 for four pairs of normal quality twisted pair wires. The third is 100Base-FX for multimode optical fiber cables. The 100Base-T standard is the most widely used Ethernet standard. The vast majority of implementations of the 100Base-T standard in use are 100Base-TX implementations. The 100Base-TX standard relies on one pair of wires for the transmit direction and relies on one pair of wires for the receive direction.

A line code is a signaling method that is used in a telecommunication system for transmitting information. One of the line codes that is used by the 100Base-TX standard is Multi-Level Threshold-3 (MLT-3) encoding. The MLT-3 encoding method uses three voltage levels. The voltage levels are designated "plus one" (+1) voltage and "zero" (0) voltage and "minus one" (−1) voltage. The MLT-3 encoding method will select one of the three voltage levels (or "states") for the transmission of a data bit.

The MLT-3 encoding method will use either a "plus one" (+1) voltage level or a "minus one" (−1) voltage level to transmit a "one bit" (1). The MLT-3 encoding method will use a "zero" voltage level to transmit a "zero bit" (0). For example, assume that the current bit to be transmitted is a "one bit" (1). Then the MLT-3 voltage level will be a "plus one" (+1) voltage. If the next bit to be transmitted after that is a "zero bit" (0), then the next MLT-3 voltage level will be the "zero" (0) voltage level. If the next bit to be transmitted after that is a "one bit" (1), then the next MLT-3 voltage level will be the "minus one" (−1) voltage level.

To transmit a "zero bit" (0) the MLT-3 encoding method selects the "zero" (0) voltage level. To transmit a "one bit" (1) the MLT-3 encoding method will (A) select the "plus one" (+1) voltage level if the last "one bit" (1) was transmitted using the "minus one" (−1) voltage level, or (B) select the "minus one" (−1) voltage level if the last "one bit" (1) was transmitted using the "plus one" (+1) voltage level.

FIG. 1 illustrates the application of the MLT-3 encoding method to a sample binary bit sequence. FIG. 1(a) shows a clock signal 100. FIG. 1(b) shows a sample binary bit sequence 110. FIG. 1(c) shows a resulting encoded signal 120 that is obtained by applying the MLT-3 encoding method to the sample binary bit sequence 110.

There is a need in the art for a system and method that allows a user to send additional data over a 100Base-T Ethernet link while the 100Base-T Ethernet link is in operation. There is a need in the art for a system and method that allows a user to incorporate an additional low data rate data channel in a 100Base-T Ethernet link.

SUMMARY OF THE INVENTION

To address the above-discussed deficiencies of the prior art, it is a primary object of the present invention to provide a system and method for adding a low data rate data channel to a 100Base-T Ethernet link.

The system and method of the present invention comprises a dual data channel transmitter that encodes a high data rate data stream in an MLT-3 encoder and that encodes a low data rate data stream using bit representations that are not valid bit representations in the 100Base-TX MLT-3 encoding method. The dual data channel transmitter transmits both of the encoded bit streams in a combined single dual data stream. The system and method of the present invention also comprises a dual data channel receiver that receives the combined single dual data stream. The receiver separates and decodes the two bit streams. The invention thereby provides a low data rate data channel in conjunction with a high data rate data channel without significantly impacting the operation of the high data rate data channel.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future, uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which:

FIG. 1 is illustrates the application of the MLT-3 encoding method to an exemplary binary bit sequence;

FIG. 2 illustrates a representation of a bit one ("1") in a low data rate data source in accordance with one embodiment of the invention;

FIG. 3 illustrates a representation of a bit zero ("0") in a low data rate data source in accordance with one embodiment of the invention;

FIG. 4 illustrates the application of an advantageous embodiment of an encoding method of the present invention to an exemplary binary bit sequence;

FIG. 4(a) illustrates an exemplary bit stream from a low data rate data source in which the bits are to be encoded in accordance with one embodiment of the invention;

FIG. 4(b) illustrates an exemplary bit stream from a modified MLT-3 channel in which the bit stream from the low data rate data source shown in FIG. 4(a) has been encoded and inserted in accordance with one embodiment of the invention;

FIG. 4(c) illustrates a decoded bit stream of the low data rate data that is obtained by applying the decoding method of the invention to the bit sequence shown in FIG. 4(b);

DETAILED DESCRIPTION OF THE INVENTION

Figure 1A:
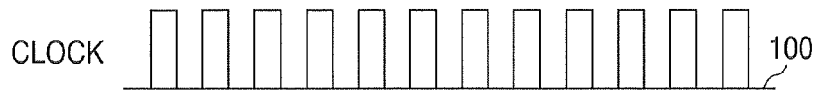
FIG. 1(a) illustrates a clock signal.
Figure 1B:
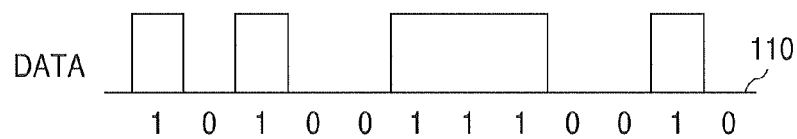
FIG. 1(b) illustrates an exemplary binary bit sequence.
Figure 1C:
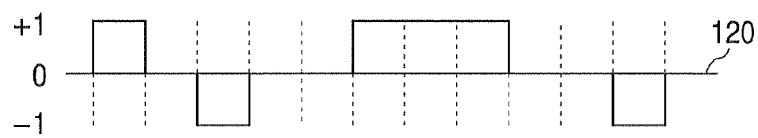
FIG. 1(c) illustrates an encoded signal that is obtained by applying a MLT-3 encoding method to the exemplary binary bit sequence shown in FIG. 1(b)

FIGS. 2 through 9 and the various embodiments used to describe the principles of the present invention in this patent document are by way of illustration only and should not be construed in any way to limit the scope of the invention. Those skilled in the art will understand that the principles of the present invention may be implemented in any type of suitably arranged data transmission system.

As previously described, the MLT-3 encoding method uses the three voltage levels (+1, 0, −1) during the transmission of data. In the MLT-3 encoding method it is considered an error condition if a transition from a plus one (+1) level to a zero (0) is followed by a transition to another plus one (+1) level. That is, the MLT-3 sequence of a plus one (+1) level followed by one or more zero (0) levels followed by another plus one (+1) level is not permitted in the MLT-3 encoding method.

Similarly, it is also consider an error condition if a transition from a minus one (−1) level to a zero (0) is followed by a transition to another minus (−1) level. That is, the MLT-3 sequence of a minus one (−1) level followed by one or more zero (0) levels followed by another minus one (−1) level is not permitted in the MLT-3 encoding method.

The present invention utilizes these error conditions in the MLT-3 encoding method to encode data bits in a low data rate data stream. The low data rate data stream comprises a secondary data channel. The high data rate data stream comprises a primary channel. As will be more fully described, the present invention also provides a dual data channel transmitter (and complementary dual data channel receiver) that can encode and insert a low data rate data stream in a high data rate data stream that is encoded following the principles of the MLT-3 encoding method.

FIG. 2 illustrates a representation of a bit one ("1") in a low data rate data source in accordance with one embodiment of the invention. Bit one ("1") in a low data rate data stream of the invention is represented by a sequence of a plus one (+1) level followed by one or more zero (0) levels followed by another plus one (+1) level. Although this sequence is not a valid data sequence in the MLT-3 encoding method, the apparatus of the invention is capable of detecting this sequence and interpreting the sequence as representing a bit one ("1") in a low data rate data stream.

FIG. 3 illustrates a representation of a bit zero ("0") in a low data rate data source in accordance with one embodiment of the invention. Bit zero ("0") in a low data rate data stream of the invention is represented by a sequence of a minus one (−1) level followed by one or more zero (0) levels followed by another minus one (−1) level. Although this sequence is not a valid data sequence in the MLT-3 encoding method, the apparatus of the invention is capable of detecting this sequence and interpreting the sequence as representing a bit zero ("0") in a low data rate data stream.

FIG. 4 illustrates the application of an advantageous embodiment of the encoding method of the present invention to an exemplary binary bit sequence. FIG. 4(a) illustrates an exemplary bit stream from a low data rate data source in which the data bits are encoded in accordance with the principles of the invention. The blanks in FIG. 4(a) represent non-data positions. The first bit to be encoded in the low data rate bit stream is a bit one 410 (shown in a square box in FIG. 4(a)). The second bit to be encoded in the low data rate bit stream is a bit zero 420 (also shown in a square box in FIG. 4(a)).

The rate at which the data bits in the low data rate bit stream are encoded must be slow enough (or must be flow controlled) to allow the proper transmission of the bits in the primary channel. Most digital signal processing (DSP) loops in an Ethernet receiver have slow enough bandwidth that the addition of the new sequences will not cause significant perturbations to the loop.

The apparatus of the invention encodes the bit one 410 in FIG. 4(a) as a sequence of plus one (1) level, a zero (0) level, and another plus one (1) level. The primary MLT-3 bit stream is then modified by inverting the polarity of a multiplicity of minus one (−1) levels to create the encoded sequence (1, 0, 1) that is shown as sequence 430 in FIG. 4(b). The apparatus of the invention encodes the bit zero 420 in FIG. 4(a) as a sequence of a minus one (−1) level, a zero (0) level, and another minus one (−1) level. The primary MLT-3 bit stream is then modified by inverting the polarity of a plurality of plus one (1) levels to create the encoded sequence (−1, 0, −1) shown as sequence 440 in FIG. 4(b).

It is important to note that the process of incorporating the low data rate channel does not change the number of bit transitions in the MLT-3 data stream. In other words, the original MLT-3 data stream and the resulting MLT-3 data stream have the same number of logic one levels (1, −1) and the same number of logic zero (0) levels. The difference between the original MLT-3 data stream and the modified MLT-3 data stream is in the actual number of plus one (1) levels and minus one (−1) levels that each data stream carries.

Although the sequence 430 is shown as comprising a single zero (0) level between two plus one (1) levels, it is understood that more than one zero (0) level may be used. The sequence may comprise a first plus one (1) level, one or more zero (0) levels, and a second plus one (1) level. Similarly, there can be a plurality of plus one (1) levels on either side of the zero (0) levels in accordance with the high data rate primary data stream.

Similarly, although the sequence 440 is shown as comprising a single zero (0) level between two minus one (−1) levels, it is understood that more than one zero (0) level may be used. The sequence may comprise a first minus one (−1) level, one or more zero (0) levels, and a second minus one (−1) level. Similarly, there can be a plurality of minus one (−1) levels on either side of the zero (0) levels in accordance with the high data rate primary data stream.

When the modified MLT-3 encoded bit stream shown in FIG. 4(b) is subsequently decoded in a dual data channel receiver of the present invention, a low data rate receive controller in the dual data channel receiver (1) identifies the low data rate sequence (1, 0, 1) 430 as a low data rate bit one, and (2) identifies the low data rate sequence (−1, 0, −1) 440 as a low data rate bit zero.

The low data rate receive controller is able to easily identify the low data rate sequence for bit one (1, 0, 1) and the low data rate sequence for bit zero (−1, 0, −1) because these sequences do not appear during the normal operation of the MLT-3 encoding method. The high data rate decoder in the receiver, on the other hand, simply ignores the polarity of the one levels and decodes both the plus one (1) level and the minus one (−1) level as a logic high level. The zero (0) levels are decoded as logic low levels.

Figure 5:
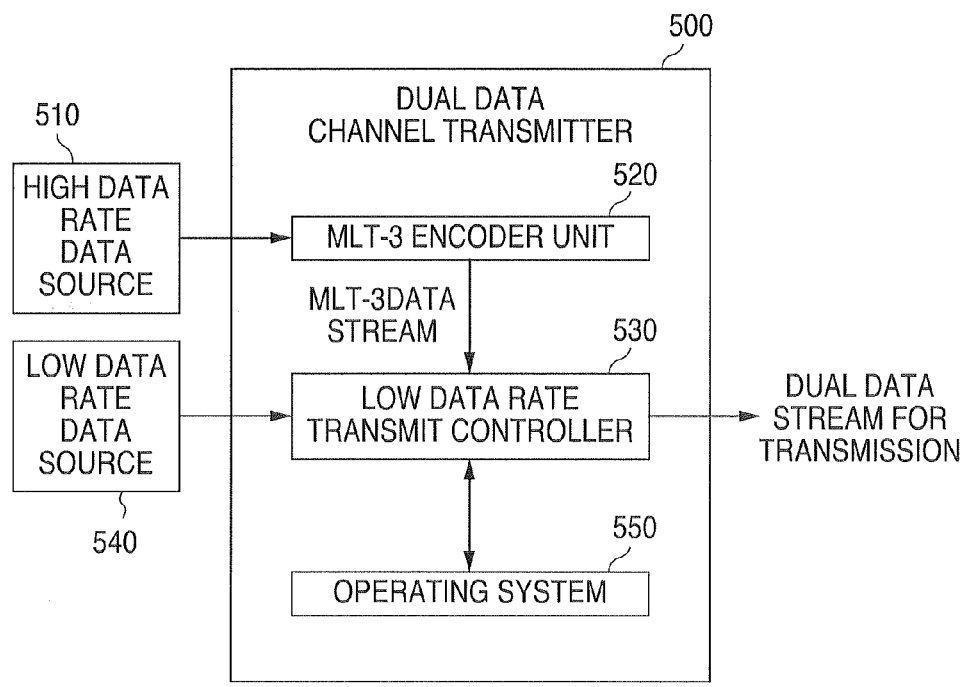
FIG. 5 illustrates a block diagram of a dual data channel transmitter of the invention.

FIG. 5 illustrates a block diagram of a dual data channel transmitter 500 of the invention. Not all of the elements of a transmitter device are shown FIG. 5. Only the elements that are necessary to describe the operation of the invention are shown in FIG. 5. It is understood that the dual data channel transmitter 500 possesses the other (non-illustrated) elements that are common to digital data transmitters.

A high data rate data source 510 provides a high data rate data stream to an MLT-3 encoder unit 520 in the dual data channel transmitter. The MLT-3 encoder unit 520 encodes the high data rate data stream and provides the MLT-3 encoded data stream to a low data rate transmit controller 530. The low data rate transmit controller 530 also receives a low data rate data stream from a low data rate data source 540.

The low data rate transmit controller 530 encodes the low data rate data in the previously described manner. The low data rate transmit controller 530 then modifies the MLT-3 encoded data stream (the high data rate data stream) to incorporate the encoded low data rate stream into a dual data stream for transmission to a dual data stream receiver of the invention.

The dual data channel transmitter 500 also comprises an operating system 550 that controls the operations of the MLT-3 encoder unit 520 and that controls the operations of the low data rate transmit controller 530.

Figure 6:
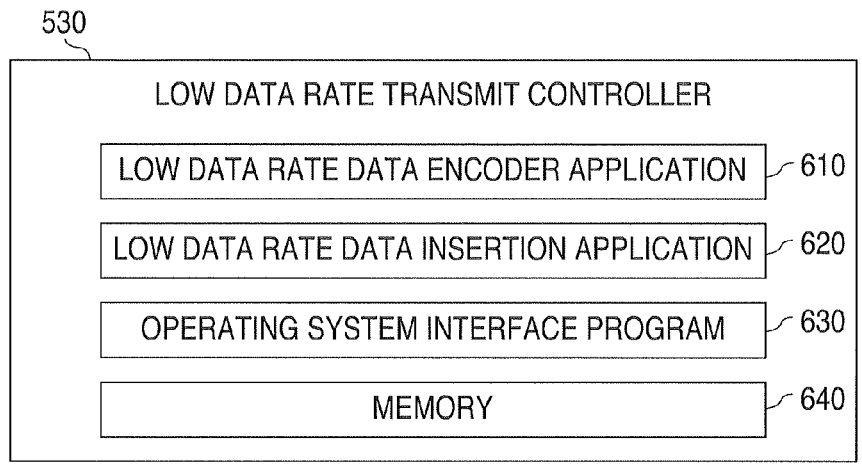
FIG. 6 illustrates a block diagram of a low data rate transmit controller of the invention.

FIG. 6 illustrates a block diagram of the low data rate transmit controller 530 of the invention. The low data rate transmit controller 530 comprises a low data rate data encoder application 610, a low data rate data insertion application 620, an operating system interface program 630 that accesses the operating system 550 of the dual data channel transmitter 500, and a memory 640 that contains computer software instructions for carrying out the operations of the low data rate transmit controller 530.

The low data rate transmit controller 530 comprises a low data rate encoder application 610 that operates in accordance with the principles of the invention that have been previously described. The low data rate encoder application 610 encodes each bit one ("1") from the low data rate data source 540 as a (1, 0, 1) sequence and each bit zero ("0") from the low data rate data source 540 as a (−1, 0, −1) sequence.

The low data rate data insertion application 620 inserts these encoded sequences into the MLT-3 encoded data stream (the high data rate data stream) from the MLT-3 encoder unit 520. The combined data streams form a dual data stream that is transmitted to a dual data channel receiver of the invention.

The low data rate transmit controller 530 and the computer instructions in the software of the low data rate data encoder application 610 and the computer instructions in the software of the low data rate data insertion application 620 together comprise an apparatus that creates a dual data stream in accordance with the principles of the invention.

Figure 7:
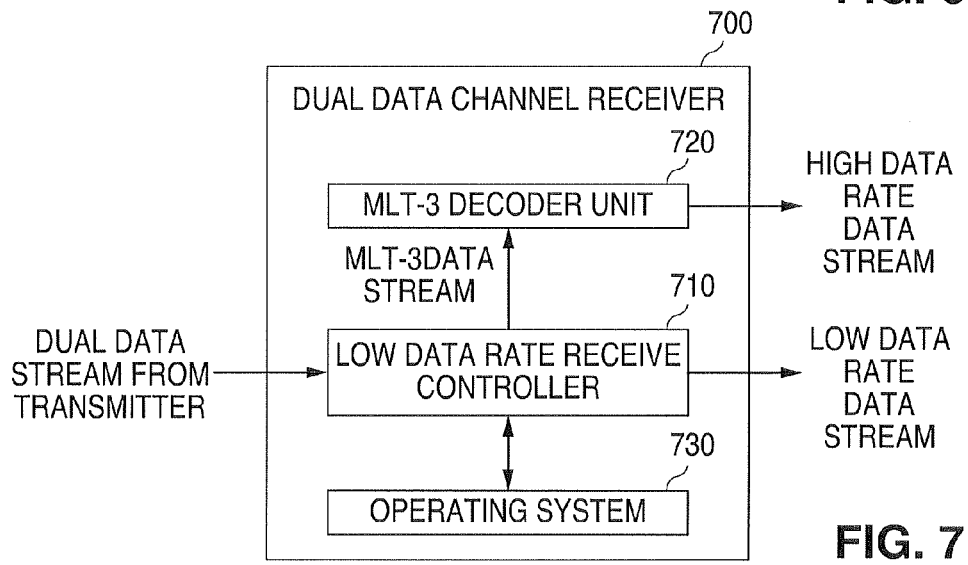
FIG. 7 illustrates a block diagram of a dual data channel receiver of the invention.

FIG. 7 illustrates a block diagram of a dual data channel receiver 700 of the invention. Not all of the elements of a receiver device are shown FIG. 7. Only the elements that are necessary to describe the operation of the invention are shown in FIG. 7. It is understood that the dual data channel receiver 700 possesses the other (non-illustrated) elements that are common to digital data receivers.

A low data rate receiver controller 710 of the dual data channel receiver 700 receives a dual data stream from the dual data channel transmitter 500. The low data rate receiver controller 710 extracts the low data rate data from the dual data stream. The low data rate receiver controller 710 sends the recovered MLT-3 encoded data stream to an MLT-3 decoder unit 720. The MLT-3 decoder unit 720 then decodes the MLT-3 encoded data stream to recover the high data rate data stream that originated in the high data rate data source 510.

The low data rate receiver controller 710 also decodes the low data rate data stream to recover the low data rate data stream that originated in the low date rate data source 540.

The dual data channel receiver 700 also comprises an operating system 730 that controls the operations of the MLT-3 decoder unit 720 and that controls the operations of the low data rate receive controller 710.

Figure 8:
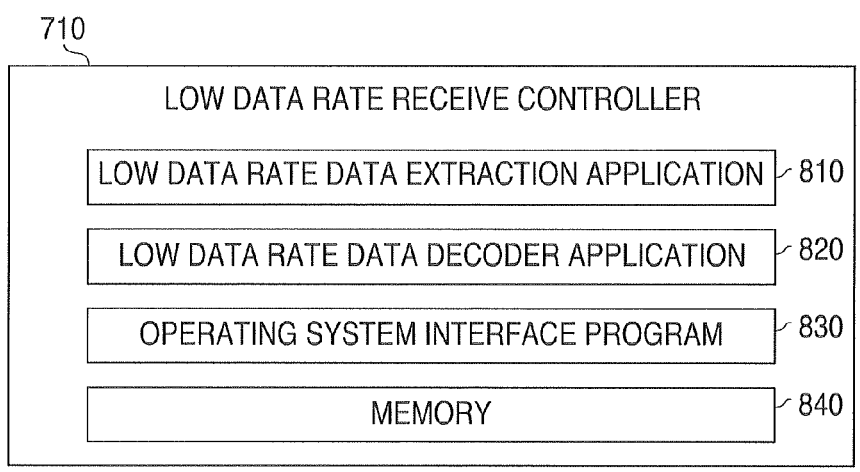
FIG. 8 illustrates a block diagram of a low data rate receive controller of the invention.

FIG. 8 illustrates a block diagram of the low data rate receive controller 710 of the invention. The low data rate receive controller 710 comprises a low data rate extraction application 810, a low data rate decoder application 820, a base line wander adjustment application 830, an operating system interface program 840 that accesses the operating system 730 of the dual data channel receiver 700, and a memory 850 that contains computer software instructions for carrying out the operations of the low data rate receive controller 710.

The low data rate receive controller 710 comprise a low data rate extraction application 810 that identifies the encoded low data rate data bits in the dual data stream in accordance with the principle of the invention that have been previously described. The low data rate extraction application 810 identifies each (1, 0, 1) sequence as a low data rate "bit one" and identifies each (−1, 0, −1) sequence as a low data rate "bit zero". The low data rate extraction application 810 removes these encoded sequences from the dual data stream by inverting the polarity of a (1, 0, 1) sequence to a (1, 0, −1) sequence and by inverting the polarity of a (−1, 0, −1) sequence to a (−1, 0, 1) sequence. The resulting data stream is the MLT-3 encoded high data rate data stream. The low data rate data extraction application 810 sends the MLT-3 encoded data stream to the MLT-3 decoder unit 720 where the MLT-3 encoded data stream is decoded as previously described.

The low data rate data decoder application 820 decodes each (1, 0, 1) sequence as a low data rate "bit one" and decodes each (−1, 0, −1) sequence as a low data rate "bit zero". The decoded low data rate data bits comprise the low data rate data stream that originated in the low date rate data source 540.

The low data rate receive controller 710 and the computer instructions in the software of the low data rate data extraction application 810 and the computer instructions in the software of the low data rate data decoder application 820 together comprise an apparatus that decodes a dual data stream in accordance with the principles of the invention.

Figure 9:
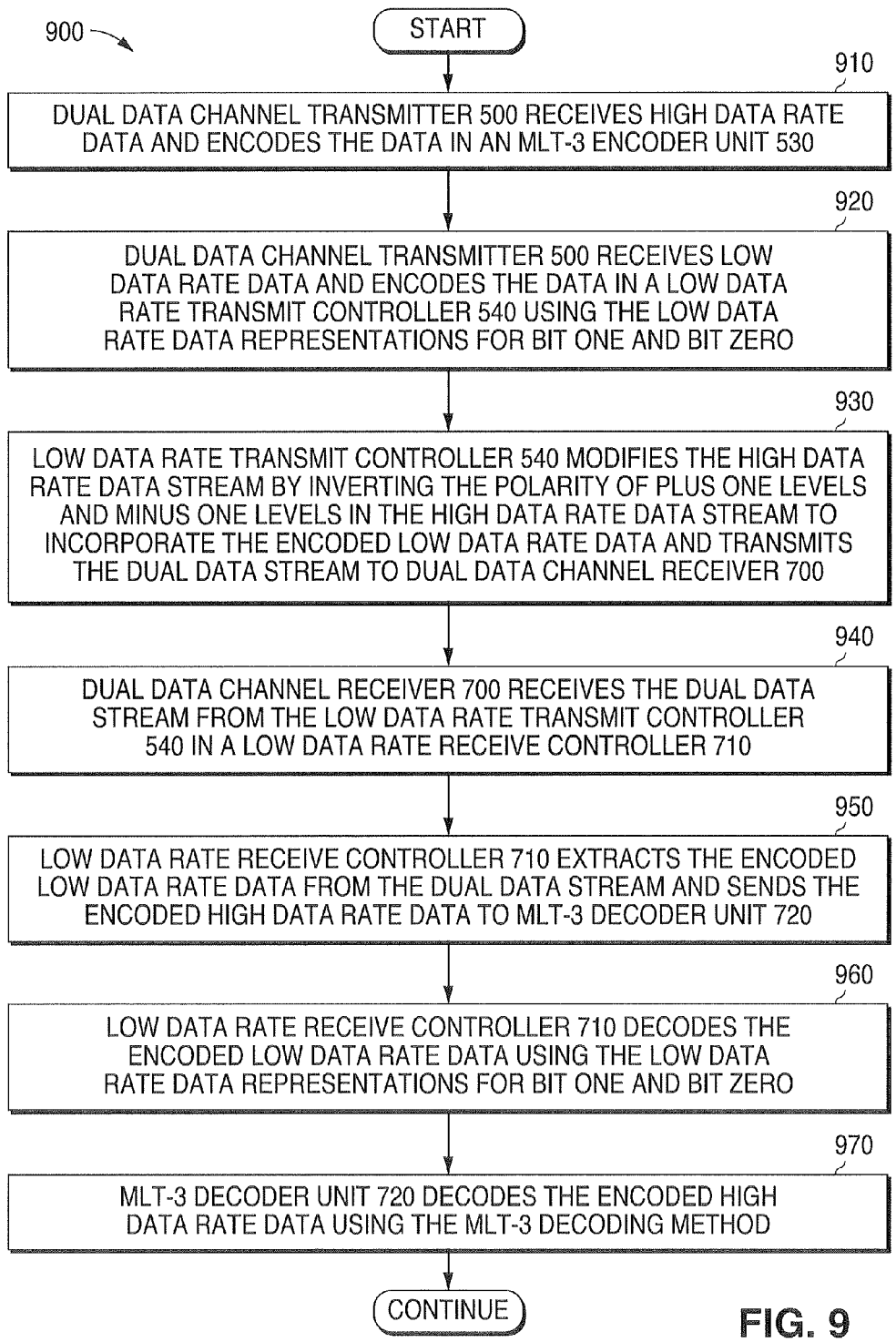
FIG. 9 is a flow chart illustrating an advantageous embodiment of a method of the present invention.

FIG. 9 is a flow chart 900 illustrating an advantageous embodiment of a method of the present invention. Dual data channel transmitter 500 receives high data rate data and encodes the data in an MLT-3 encoder unit 530 (step 910). The dual data channel transmitter 500 also receives low data rate data and encodes the data in a low data rate transmit controller 540 using the low data rate data source representations for bit one ("1") and bit zero ("0") (step 920). The low data rate transmit controller 540 modifies the high data rate data stream by inverting the polarity of plus one (1) levels and minus one (−1) levels in the high data rate data stream to incorporate the encoded low data rate data and transmits the dual data stream to dual data channel receiver 700 (step 930).

Dual data channel receiver 700 receives the dual data stream from the low data rate transmit controller 540 in a low data rate receive controller 710 (step 940). Low data rate receive controller 710 extracts the encoded low data rate data from the dual data stream and sends the encoded high data rate data to MLT-3 decoder unit 720 (step 950).

Low data rate receive controller 710 decodes the encoded low data rate data using the low data rate data source representations for bit one ("1") and bit zero ("0") (step 960). MLT-3 decoder unit 720 decodes the encoded high data rate data using the MLT-3 decoding method (step 970).

The operation of the method that is described in the present invention may cause an increase in the base line wander (BLW) in the receiver as a result of the new symbols that are not direct current (DC) balanced. The increase in base line wander can be handled by increasing the range of the base line wander loop in the receiver. The increase in base line wander can also be avoided by restricting the transmission of the low data rate data sequences to occur during the 100Base-T idle state (i.e., transmission of an idle pattern during inter frame gap).

The base line wander problem can also be minimized by analyzing the data pattern in advance of the transmission and intelligently inserting the low data rate data sequences at locations that minimize the increase in base line wander.

Another method to avoid the increase in base line wander (BLW) is to encode a logic level by inserting both new sequences but in reverse order. For example, a low data rate "bit one" would be encoded by (1, 0, 1, 0 . . . −1, 0, −1). A low data rate "bit zero" would be encoded by (−1, 0, −1, 0 . . . , 1, 0, 1). Two consecutive (1, 0, 1) sequences or two consecutive (−1, 0, −1) sequences could be used as delimiters if needed.

While the present invention has been described in connection with a 100Base-T Ethernet link, it is understood that the present invention is not limited to use with a 100Base-T Ethernet link. The present invention may be used with any telecommunications link that is compatible with an MLT-3 encoding method.

Although the present invention has been described with several embodiments, various changes and modifications may be suggested to one skilled in the art. It is intended that the present invention encompass such changes and modifications as fall within the scope of the appended claims.

What is claimed is:

1. An apparatus comprising a dual data channel transmitter that is configured to transmit a dual data stream that comprises:
   a first data stream encoded with a multilevel threshold three (MLT-3) coding method; and
   a second data stream encoded with a modified MLT-3 coding method having sequences of voltage levels such that each bit value is represented by one of:
      a first plus one voltage level followed by at least one zero voltage level followed by a second plus one voltage level; and
      a first minus one voltage level followed by at least one zero voltage level followed by a second minus one voltage level.

2. The apparatus as set forth in claim 1, wherein a bit one of the second data stream is represented by the sequence of modified MLT-3 voltage levels having the first plus one voltage level followed by the at least one zero voltage level followed by the second plus one voltage level.

3. The apparatus as set forth in claim 1, wherein a bit zero of the second data stream is represented by the sequence of modified MLT-3 voltage levels having the first minus one voltage level followed by the at least one zero voltage level followed by the second minus one voltage level.

4. The apparatus as set forth in claim 1, wherein said dual channel data transmitter comprises:
   an MLT-3 encoder unit that is configured to encode data from a first data source to create said first data stream; and
   a low data rate transmit controller that is configured to encode data from a second data source to create said second data stream.

5. The apparatus as set forth in claim 4, wherein said low data rate transmit controller is configured to insert said second data stream into said first data stream to form said dual data stream.

6. The apparatus as set forth in claim 5, wherein said second data stream has a lower data rate than the first data stream.

7. The apparatus as set forth in claim 4, wherein said low data rate transmit controller comprises:
   a low data rate data encoder application that is configured to encode said data from said second data source to create said second data stream; and
   a low data rate data insertion application that is configured to insert said second data stream by modifying said first data stream to form said dual data stream.

8. The apparatus as set forth in claim 4, wherein said low data rate transmit controller is configured to encode said data from said second data source to create said second data stream using:
   a bit representation for a bit one of the second data stream that comprises the sequence of modified MLT-3 voltage levels having the first plus one voltage level followed by the at least one zero voltage level followed by the second plus one voltage level; and
   a bit representation for a bit zero of the second data stream that comprises the sequence of modified MLT-3 voltage levels having the first minus one voltage level followed by the at least one zero voltage level followed by the second minus one voltage level.

9. An apparatus comprising a dual data channel receiver that is configured to receive a dual data stream that comprises:

a first data stream encoded with a multilevel threshold three (MLT-3) coding method; and a second data stream encoded with a modified MLT-3 coding method having sequences of voltage levels such that each bit value is represented by one of:
- a first plus one voltage level followed by at least one zero voltage level followed by a second plus one voltage level, and
- a first minus one voltage level followed by at least one zero voltage level followed by a second minus one voltage level.

10. The apparatus as set forth in claim 9, wherein a bit one of the second data stream is represented by the sequence of modified MLT-3 voltage levels having the first plus one voltage level followed by the at least one zero voltage level followed by the second plus one voltage level.

11. The apparatus as set forth in claim 9, wherein a bit zero of the second data stream is represented by the sequence of modified MLT-3 voltage levels having the first minus one voltage level followed by the at least one zero voltage level followed by the second minus one voltage level.

12. The apparatus as set forth in claim 9, wherein said dual channel data receiver comprises:
- an MLT-3 decoder unit that is configured to decode data from said first data stream of said dual data stream; and
- a low data rate receive controller that is configured to decode data from said second data stream of said dual data stream.

13. The apparatus as set forth in claim 12, wherein said low data rate receive controller is configured to extract said second data stream from said dual data stream.

14. The apparatus as set forth in claim 13, wherein said second data stream has a lower data rate than the first data stream.

15. The apparatus as set forth in claim 12, wherein said low data rate receive controller comprises:
- a low data rate data extraction application that is configured to extract said second data stream from said dual data stream; and
- a low data rate data decoder application that is configured to decode said second data stream.

16. The apparatus as set forth in claim 12, wherein said low data rate receiver controller is configured to decode data from said second data stream using:
- a bit representation for a bit one of the second data stream that comprises the sequence of modified MLT-3 voltage levels having the first plus one voltage level followed by the at least one zero voltage level followed by the second plus one voltage level; and
- a bit representation for a bit zero of the second data stream that comprises the sequence of modified MLT-3 voltage levels having the first minus one voltage level followed by the at least one zero voltage level followed by the second minus one voltage level.

17. A method of operating a dual data channel transmitter to transmit a dual data stream, wherein the method comprises the steps of:

encoding a first data stream with a multilevel threshold three (MLT-3) coding method;

encoding a second data stream with a modified MLT-3 coding method having sequences of voltage levels such that each bit value is represented by one of:
- a first plus one voltage level followed by at least one zero voltage level followed by a second plus one voltage level; and
- a first minus one voltage level followed by at least one zero voltage level followed by a second minus one voltage level;

modifying the first encoded data stream to include the second encoded data stream to form the dual data stream; and transmitting the dual data stream using the transmitter.

18. The method as set forth in claim 17, wherein:
- a bit one in the second data stream is represented by the sequence comprising the first plus one voltage level followed by the at least one zero voltage level followed by the second plus one voltage level; and
- a bit zero in the second data stream is represented by the sequence comprising the first minus one voltage level followed by the at least one zero voltage level followed by the second minus one voltage level.

19. A method of operating a dual data channel receiver that receives a dual data stream, wherein the method comprises the steps of:

receiving the dual data stream in the dual data channel receiver;

extracting from the dual data stream a first data stream encoded with a multilevel threshold three (MLT-3) coding method;

decoding the first data stream;

extracting from the dual data stream a second data stream encoded with a modified MLT-3 coding method having sequences of voltage levels such that each bit value is represented by one of:
- a first plus one voltage level followed by at least one zero voltage level followed by a second plus one voltage level; and
- a first minus one voltage level followed by at least one zero voltage level followed by a second minus one voltage level; and decoding the second data stream.

20. The method as set forth in claim 19, wherein:
- a bit one in the second data stream is represented by the sequence comprising the first plus one voltage level followed by the at least one zero voltage level followed by the second plus one voltage level; and
- a bit zero in the second data stream is represented by the sequence comprising the first minus one voltage level followed by the at least one zero voltage level followed by the second minus one voltage level.

* * * * *